(12) United States Patent
Kapoor et al.

(10) Patent No.: US 8,185,694 B2
(45) Date of Patent: May 22, 2012

(54) TESTING REAL PAGE NUMBER BITS IN A CACHE DIRECTORY

(75) Inventors: Shakti Kapoor, Austin, TX (US); Shiraz M. Zaman, New Delhi (IN)

(73) Assignee: International Business Machines Corporation, Armonk, NY (US)

( * ) Notice: Subject to any disclaimer, the term of this patent is extended or adjusted under 35 U.S.C. 154(b) by 549 days.

(21) Appl. No.: 12/179,654

(22) Filed: Jul. 25, 2008

(65) Prior Publication Data

US 2010/0023697 A1 Jan. 28, 2010

(51) Int. Cl.
*G06F 12/08* (2006.01)

(52) U.S. Cl. .............................. 711/128; 711/E12.029

(58) Field of Classification Search .................. None
See application file for complete search history.

(56) References Cited

U.S. PATENT DOCUMENTS

| | | | |
|---|---|---|---|
| 5,355,471 A | 10/1994 | Weight | |
| 5,502,732 A | 3/1996 | Arroyo et al. | |
| 5,524,208 A | 6/1996 | Finch et al. | |
| 5,613,087 A | 3/1997 | Chin et al. | |
| 5,617,531 A * | 4/1997 | Crouch et al. | 714/30 |
| 5,671,231 A | 9/1997 | Cooper et al. | |
| 5,692,167 A | 11/1997 | Grochowski et al. | |
| 5,740,353 A * | 4/1998 | Kreulen et al. | 714/42 |
| 5,831,997 A | 11/1998 | Kodashiro | |
| 5,938,777 A | 8/1999 | Carter | |
| 5,956,478 A | 9/1999 | Huggins | |
| 5,960,457 A | 9/1999 | Skovan et al. | |
| 5,996,034 A | 11/1999 | Carter | |
| 6,055,630 A | 4/2000 | D'Sa et al. | |
| 6,070,227 A | 5/2000 | Rokicki | |
| 6,195,729 B1 | 2/2001 | Arimilli et al. | |
| 6,275,752 B1 | 8/2001 | Giers | |
| 6,292,906 B1 | 9/2001 | Fu et al. | |
| 6,311,286 B1 | 10/2001 | Bertone et al. | |
| 6,357,020 B1 | 3/2002 | Bohizic et al. | |
| 6,389,512 B1 | 5/2002 | Mahalingaiah et al. | |
| 6,493,814 B2 | 12/2002 | Fields, Jr. et al. | |
| 6,502,212 B1 | 12/2002 | Coyle et al. | |

(Continued)

OTHER PUBLICATIONS

O'Krafka et al., "MPTG: A Portable Test Generator for Cache-Coherent Multiprocessor", Proceedings of the 1995 IEEE Fourteenth Annual International Phoenix Conferernce on Computers and Communications, Mar. 1995, pp. 38-44.

(Continued)

*Primary Examiner* — Denise Tran
(74) *Attorney, Agent, or Firm* — Francis Lammes; Stephen J. Walder, Jr.; Matthew B. Talpis

(57) ABSTRACT

Testing real page number bits in a cache directory is provided. A specification of a cache to be tested is retrieved in order to test the real page number bits of the cache directory associated with the cache. A range within a real page number address of the cache directory is identified for performing page allocations using the specification of the cache. A random value x is generated that identifies a portion of the real page number bits to be tested. A first random value y is generated that identifies a first congruence class from a set of congruence classes within the portion of the cache to be tested. Responsive to the first congruence class failing to be allocated a predetermined number of times, one page size of memory for the first congruence class is allocated and a first allocation value is incremented by a value of 1.

20 Claims, 5 Drawing Sheets

U.S. PATENT DOCUMENTS

| | | |
|---|---|---|
| 6,769,083 B1 | 7/2004 | Tsuto et al. |
| 6,820,219 B1 | 11/2004 | Huang et al. |
| 6,832,333 B2 | 12/2004 | Johnson et al. |
| 6,907,548 B2 | 6/2005 | Abdo |
| 6,990,621 B2 | 1/2006 | Maneparambil et al. |
| 7,020,811 B2 | 3/2006 | Byrd |
| 7,137,055 B2 | 11/2006 | Hirano et al. |
| 7,159,144 B2 | 1/2007 | Babu et al. |
| 7,334,159 B1 | 2/2008 | Callaghan |
| 7,359,822 B2 | 4/2008 | Fujiwara et al. |
| 7,366,847 B2 | 4/2008 | Kruckemyer et al. |
| 7,392,441 B2 | 6/2008 | Kehne et al. |
| 7,437,262 B2 | 10/2008 | Boose et al. |
| 7,454,678 B2 | 11/2008 | Cullen et al. |
| 7,530,066 B2 | 5/2009 | Chang |
| 7,584,394 B2 | 9/2009 | Choudhury et al. |
| 7,590,910 B2 | 9/2009 | Haroun et al. |
| 7,624,312 B2 | 11/2009 | Kehne et al. |
| 7,647,539 B2 | 1/2010 | Bussa et al. |
| 7,661,023 B2 | 2/2010 | Arora et al. |
| 7,669,012 B2 | 2/2010 | Blumrich et al. |
| 7,689,886 B2 | 3/2010 | Arora et al. |
| 7,747,908 B2 | 6/2010 | Choudhury et al. |
| 7,783,840 B2 | 8/2010 | Hataida et al. |
| 7,937,532 B2 | 5/2011 | Kunze et al. |
| 7,987,348 B2 | 7/2011 | Swanson et al. |
| 2003/0149916 A1 | 8/2003 | Ohtake et al. |
| 2004/0111656 A1 | 6/2004 | Hayden et al. |
| 2005/0166116 A1 | 7/2005 | Ramsey |
| 2005/0240732 A1* | 10/2005 | Crick et al. .......... 711/133 |
| 2007/0136532 A1 | 6/2007 | Irish et al. |
| 2008/0288725 A1 | 11/2008 | Moyer et al. |
| 2009/0024894 A1 | 1/2009 | Arora et al. |
| 2009/0138681 A1 | 5/2009 | Saha |

OTHER PUBLICATIONS

Victor et al., "Functional verification of the POWER5 microprocessor and POWER5 multiprocessor systems", IBM Journal of Research and Development, Power 5 and Packaging, vol. 49, No. 4/5, 2005, 12 pages.

Walter, Joerg, "Functional Verification of the IBM zSeries eServer z900", Proceedings of the 2002 IEEE International Conference on Computer Design: VLSI in Computers and Processors, 2002, pp. 17-21.

USPTO U.S. Appl. No. 11/779,390, 2 pages.
USPTO U.S. Appl. No. 12/172,628, 2 pages.

* cited by examiner

TESTING REAL PAGE NUMBER BITS IN A CACHE DIRECTORY

BACKGROUND OF THE INVENTION

1. Field of the Invention

The present application relates generally to an improved data processing apparatus and method and more specifically to an apparatus and method for testing real page number bits in a cache directory.

2. Background of the Invention

Conventional computer systems may have one or more processing units, which are connected to various peripheral devices, including input/output (I/O) devices (such as a display monitor, keyboard, or permanent storage device), memory devices (such as random-access memory or RAM) that are used by the processing units to carry out program instructions, and firmware whose primary purpose is to seek out and load an operating system from one of the peripherals (usually the permanent memory device) whenever the computer is first turned on. The processing units communicate with the peripheral devices by various means, including a generalized interconnect or bus. A conventional computer system may also have many additional components, such as serial and parallel ports for connection to, e.g., modems or printers. Those skilled in the art will further appreciate that there are other components that might be used in conventional computing systems; for example, a display adapter might be used to control a video display monitor, a memory controller may be used to access the memory, etc. Instead of connecting input/output (I/O) devices directly to the bus, the I/O devices may be connected to a secondary (I/O) bus which is further connected to an I/O bridge to the bus. The computer also may have more than two processing units.

In a symmetric multi-processor (SMP) computer, all of the processing units are generally identical; that is, they all use a common set or subset of instructions and protocols to operate and generally have the same architecture. Such a SMP computer may include a processing unit that includes a processor core having a plurality of registers and execution units, which carry out program instructions in order to operate the computer. The processing unit also can have one or more caches, such as an instruction cache and a data cache, which are implemented using high-speed memory devices. Instructions and data may be directed to the respective cache by examining a signal that is indicative of whether the processing unit is requesting an operation whose operand is instruction versus data. Caches are commonly used to temporarily store values that might be repeatedly accessed by a processor, in order to speed up processing by avoiding the longer step of loading the values from the memory. These caches are referred to as "on-board" when they are integrally packaged with the processor core on a single integrated chip. Each cache is generally associated with a cache controller that manages the transfer of data between the processor core and the cache memory.

A processing unit may also include additional caches, such as a second level (L2) cache that supports the on-board first level caches. In other words, the L2 cache acts as an intermediary between the memory and the on-board caches, and can store a much larger amount of information (instructions and data) than the on-board caches can, but at a longer access penalty. For example, an L2 cache may be a chip having a storage capacity of 256 or 512 kilobytes, while the processor may be an IBM PowerPC™ 604-series processor having on-board caches with 64 kilobytes of total storage. The L2 cache is generally connected to a bus, and all loading of information from the memory into the processor core must come through the L2 cache. Additionally, computing systems may include multi-level cache hierarchies where there are many levels of serially connected caches.

A cache has many "blocks" which individually store the various instructions and data values. The blocks in any cache are divided into groups of blocks called "sets." A set is a collection of cache blocks that a given memory block may reside in. For any given memory block, there is a unique set in the cache that the block can be mapped into, according to preset mapping functions. The number of blocks in a set is referred to as the associativity of the cache, e.g., 2-way set associative means that, for any given memory block there are two blocks in the cache that the memory block can be mapped into; however, several different blocks in main memory can be mapped to any given set. A 1-way set associative cache is direct mapped; that is, there is only one cache block that can contain a particular memory block. A cache is said to be fully associative if a memory block can occupy any cache block, i.e., there is one set, and the address tag is the full address of the memory block.

An exemplary cache line (block) includes an address-tag field, a state-bit field, an inclusivity-bit field, and a value field for storing the actual instruction or data. The state-bit field and inclusivity-bit field are used to maintain cache coherency in a multiprocessor computer system. The address tag is a subset of the full address of the corresponding memory block. A compare match of an incoming effective address with one of the tags within the address-tag field indicates a cache "hit." The collection of all of the address tags in a cache (and sometimes the state-bit and inclusivity-bit fields) is referred to as a directory, and the collection of all of the value fields is the cache entry array.

When all of the blocks in a set for a given cache are full and that cache receives a request, whether a "read" or "write," to a memory location that maps into the full set, the cache must "evict" one of the blocks currently in the set. The cache chooses a block by one of a number of means known to those skilled in the art (least recently used (LRU), random, pseudo-LRU, etc.) to be evicted. If the data in the chosen block is modified, that data is written to the next lowest level in the memory hierarchy which may be another cache (in the case of the L1 or on-board cache) or main memory (in the case of an L2 cache). By the principle of inclusion, the lower level of the hierarchy will already have a block available to hold the written modified data. However, if the data in the chosen block is not modified, the block is simply abandoned and not written to the next lowest level in the hierarchy. This process of removing a block from one level of the hierarchy is known as an "eviction." At the end of this process, the cache no longer holds a copy of the evicted block.

Some procedures (programs) running on a processor have the unintended effect of repeatedly using a limited number of sets (congruence classes) such that the cache is less efficient. In other words, when a procedure causes a large number of evictions in a small number of congruence class members while not using a large number of other members, there are increased memory latency delays. This effect, referred to as a stride, is related to the congruence mapping function and the manner in which the particular procedure is allocating memory blocks in the main memory device.

Generally, testing of caches in a data processing system requires the allocation of twice the amount of L2 cache. By using this amount of L2 cache, some caches may require rolling or replacement when pages that index to a single index causes existing entries to be removed or evicted and, thus, cause more stress and testing of the cache lines. While the amount of memory may be increased to accomplish the same stress of the caches, the addition of memory is not optimum. To test the real page numbers (RPN) bits in the cache directory, test programs typically go through a large amount of memory. In manufacturing and also in simulation tests, time is a critical factor. The total amount of testing time available in the card manufacturing, module manufacturing, and wafer manufacturing typically is in seconds. However, simulation also obviously has the constraint of time to simulate in cycle accurate models.

BRIEF SUMMARY OF THE INVENTION

In one illustrative embodiment, a method, in a data processing system, is provided for testing real page number bits in a cache directory. The illustrative embodiments retrieve a specification of a cache to be tested in order to test the real page number bits of the cache directory associated with the cache. The illustrative embodiments identify a range within a real page number address of the cache directory for performing page allocations using the specification of the cache. The illustrative embodiments generate a random value x that identifies a portion of the real page number bits to be tested. The illustrative embodiments generate a first random value y that identifies a first congruence class from a set of congruence classes within the portion of the cache to be tested. The illustrative embodiments determine if the first congruence class associated with the first random value y has been allocated a predetermined number of times. The illustrative embodiments allocate one page size of memory for the first congruence class associated with the first random value y and increment a first allocation value associated with the first congruence class by a value of 1.

In other illustrative embodiments, a computer program product comprising a computer useable or readable medium having a computer readable program is provided. The computer readable program, when executed on a computing device, causes the computing device to perform various ones, and combinations of, the operations outlined above with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones, and combinations of, the operations outlined above with regard to the method illustrative embodiment.

These and other features and advantages of the present invention will be described in, or will become apparent to those of ordinary skill in the art, in view of the following detailed description of the exemplary embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION OF THE INVENTION

Figure 1:
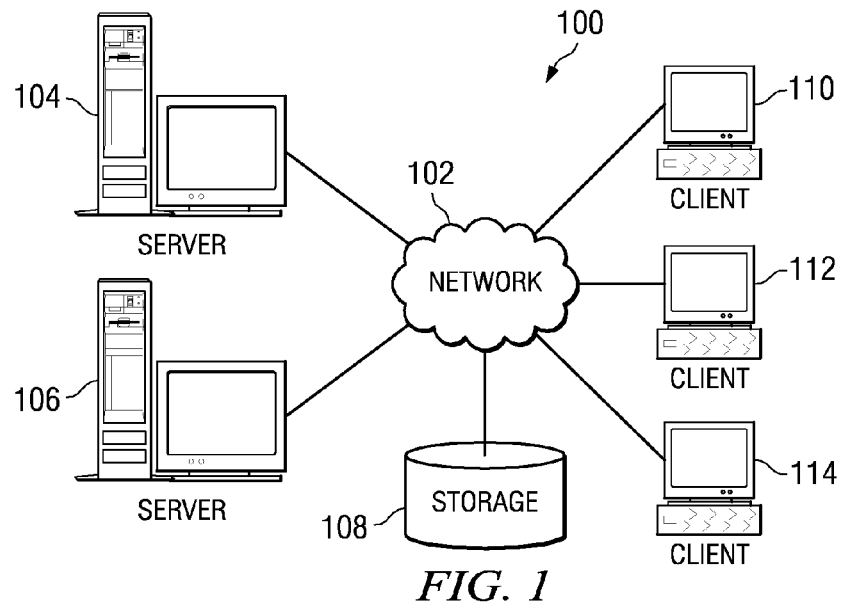
FIG. 1 depicts a pictorial representation of an exemplary distributed data processing system in which aspects of the illustrative embodiments may be implemented.

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer usable program code embodied in the medium.

Any combination of one or more computer usable or computer readable medium(s) may be utilized. The computer-usable or computer-readable medium may be, for example, but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, radio frequency (RF), etc.

Computer program code for carrying out operations of the present invention may be written in any combination of one or more programming languages, including an object oriented programming language such as Java™, Smalltalk™, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The illustrative embodiments are described below with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 2:
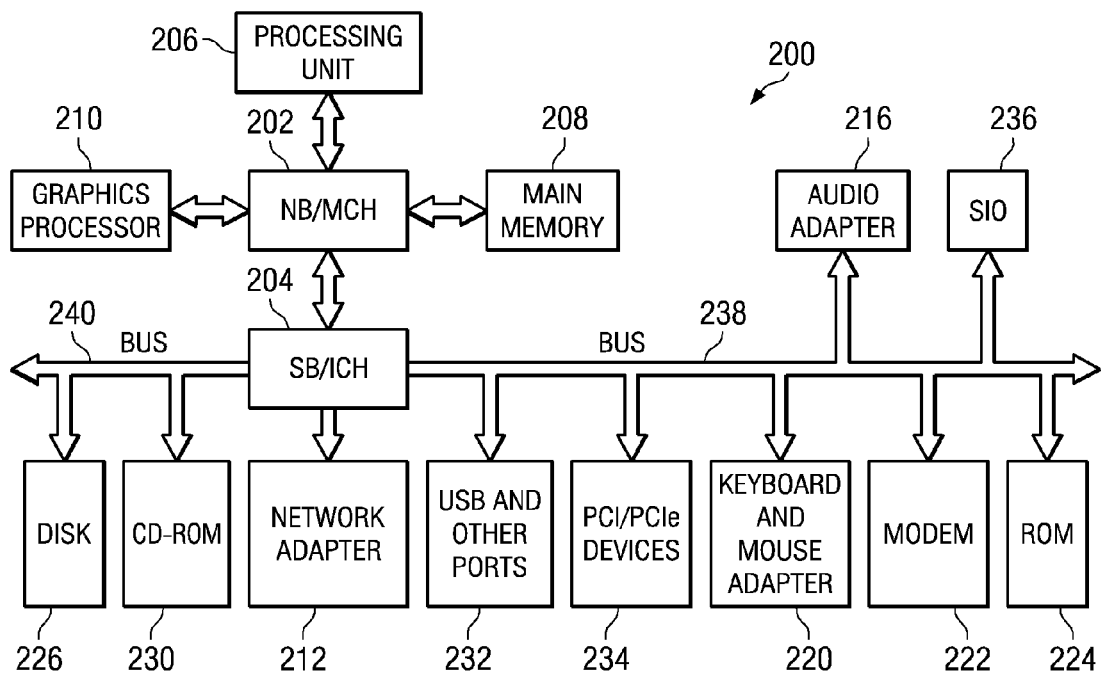
FIG. 2 shows a block diagram of an exemplary data processing system in which aspects of the illustrative embodiments may be implemented.

The illustrative embodiments provide a mechanism for testing real page number bits in a cache directory. Thus, the illustrative embodiments may be utilized in many different types of data processing environments including a distributed data processing environment, a single data processing device, or the like. In order to provide a context for the description of the specific elements and functionality of the illustrative embodiments, FIGS. 1 and 2 are provided hereafter as exemplary environments in which exemplary aspects of the illustrative embodiments may be implemented. While the description following FIGS. 1 and 2 will focus primarily on a single data processing device implementation of a mechanism for testing real page number bits in a cache directory this is only exemplary and is not intended to state or imply any limitation with regard to the features of the present invention. To the contrary, the illustrative embodiments are intended to include distributed data processing environments and embodiments in which real page number bits in a cache directory may be tested. Many modifications to the depicted environments may be made without departing from the spirit and scope of the present invention.

With reference now to the figures, FIG. 1 depicts a pictorial representation of an exemplary distributed data processing system in which aspects of the illustrative embodiments may be implemented. Distributed data processing system 100 may include a network of computers in which aspects of the illustrative embodiments may be implemented. The distributed data processing system 100 contains at least one network 102, which is the medium used to provide communication links between various devices and computers connected together within distributed data processing system 100. The network 102 may include connections, such as wire, wireless communication links, or fiber optic cables.

In the depicted example, server 104 and server 106 are connected to network 102 along with storage unit 108. In addition, clients 110, 112, and 114 are also connected to network 102. These clients 110, 112, and 114 may be, for example, personal computers, network computers, or the like. In the depicted example, server 104 provides data, such as boot files, operating system images, and applications to the clients 110, 112, and 114. Clients 110, 112, and 114 are clients to server 104 in the depicted example. Distributed data processing system 100 may include additional servers, clients, and other devices not shown.

In the depicted example, distributed data processing system 100 is the Internet with network 102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, the distributed data processing system 100 may also be implemented to include a number of different types of networks, such as for example, an intranet, a local area network (LAN), a wide area network (WAN), or the like. As stated above, FIG. 1 is intended as an example, not as an architectural limitation for different embodiments of the present invention, and therefore, the particular elements shown in FIG. 1 should not be considered limiting with regard to the environments in which the illustrative embodiments of the present invention may be implemented.

With reference now to FIG. 2, a block diagram of an exemplary data processing system is shown in which aspects of the illustrative embodiments may be implemented. Data processing system 200 is an example of a computer, such as client 110 in FIG. 1, in which computer usable code or instructions implementing the processes for illustrative embodiments of the present invention may be located.

In the depicted example, data processing system 200 employs a hub architecture including north bridge and memory controller hub (NB/MCH) 202 and south bridge and input/output (I/O) controller hub (SB/ICH) 204. Processing unit 206, main memory 208, and graphics processor 210 are connected to NB/MCH 202. Graphics processor 210 may be connected to NB/MCH 202 through an accelerated graphics port (AGP).

In the depicted example, local area network (LAN) adapter 212 connects to SB/ICH 204. Audio adapter 216, keyboard and mouse adapter 220, modem 222, read only memory (ROM) 224, hard disk drive (HDD) 226, CD-ROM drive 230, universal serial bus (USB) ports and other communication ports 232, and PCI/PCIe devices 234 connect to SB/ICH 204 through bus 238 and bus 240. PCI/PCIe devices may include, for example, Ethernet adapters, add-in cards, and PC cards for notebook computers. PCI uses a card bus controller, while PCIe does not. ROM 224 may be, for example, a flash basic input/output system (BIOS).

HDD 226 and CD-ROM drive 230 connect to SB/ICH 204 through bus 240. HDD 226 and CD-ROM drive 230 may use, for example, an integrated drive electronics (IDE) or serial advanced technology attachment (SATA) interface. Super I/O (SIO) device 236 may be connected to SB/ICH 204.

An operating system runs on processing unit 206. The operating system coordinates and provides control of various components within the data processing system 200 in FIG. 2. As a client, the operating system may be a commercially available operating system such as Microsoft® Windows® XP (Microsoft and Windows are trademarks of Microsoft Corporation in the United States, other countries, or both). An object-oriented programming system, such as the Java™ programming system, may run in conjunction with the operating system and provides calls to the operating system from Java™ programs or applications executing on data processing system 200 (Java is a trademark of Sun Microsystems, Inc. in the United States, other countries, or both).

As a server, data processing system 200 may be, for example, an IBM® eServer™ System p® computer system, running the Advanced Interactive Executive (AIX®) operating system or the LINUX® operating system (eServer, System p, and AIX are trademarks of International Business Machines Corporation in the United States, other countries, or both while LINUX is a trademark of Linus Torvalds in the United States, other countries, or both). Data processing system 200 may be a symmetric multiprocessor (SMP) system including a plurality of processors in processing unit 206. Alternatively, a single processor system may be employed.

Instructions for the operating system, the object-oriented programming system, and applications or programs are located on storage devices, such as HDD 226, and may be loaded into main memory 208 for execution by processing unit 206. The processes for illustrative embodiments of the present invention may be performed by processing unit 206 using computer usable program code, which may be located in a memory such as, for example, main memory 208, ROM 224, or in one or more peripheral devices 226 and 230, for example.

A bus system, such as bus 238 or bus 240 as shown in FIG. 2, may be comprised of one or more buses. Of course, the bus system may be implemented using any type of communication fabric or architecture that provides for a transfer of data between different components or devices attached to the fabric or architecture. A communication unit, such as modem 222 or network adapter 212 of FIG. 2, may include one or more devices used to transmit and receive data. A memory may be, for example, main memory 208, ROM 224, or a cache such as found in NB/MCH 202 in FIG. 2.

Those of ordinary skill in the art will appreciate that the hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. Also, the processes of the illustrative embodiments may be applied to a multiprocessor data processing system, other than the SMP system mentioned previously, without departing from the spirit and scope of the present invention.

Moreover, the data processing system 200 may take the form of any of a number of different data processing systems including client computing devices, server computing devices, a tablet computer, laptop computer, telephone or other communication device, a personal digital assistant (PDA), or the like. In some illustrative examples, data processing system 200 may be a portable computing device which is configured with flash memory to provide non-volatile memory for storing operating system files and/or user-generated data, for example. Essentially, data processing system 200 may be any known or later developed data processing system without architectural limitation.

By allocating contiguous memory equal to two times L2 starting from a particular address, all cache lines within a cache may be tested completely. However, in such a case only a small portion of real page number (RPN) bits would be tested. The illustrative embodiments divide RPN bits into three portions, referred to as $\alpha$, $\beta$ and $\gamma$ bits. An allocated memory resides in a particular cache lines depending upon $\gamma$-RPN bits. $\alpha$-RPN bits define the boundary of memory addresses which can be allocated depending upon the available memory. In the illustrative embodiments, the idea is to allocate one page size of memory for each RPN bit by considering $\alpha$-RPN and $\gamma$-RPN bits independently to generate an address for allocation. The presented idea is in intelligent selection of $\alpha$-RPN and $\gamma$-RPN bits and a combination of $\alpha$-RPN and $\gamma$-RPN bits to obtain an address for an allocation for one page size of memory which would simultaneously test RPN bits as well as different cache lines for each congruence class. By allocation in this manner, the illustrative embodiments ensure coverage of all of the congruence classes in the complete cache as well as all possible RPN bits in the cache directory.

Figure 3:
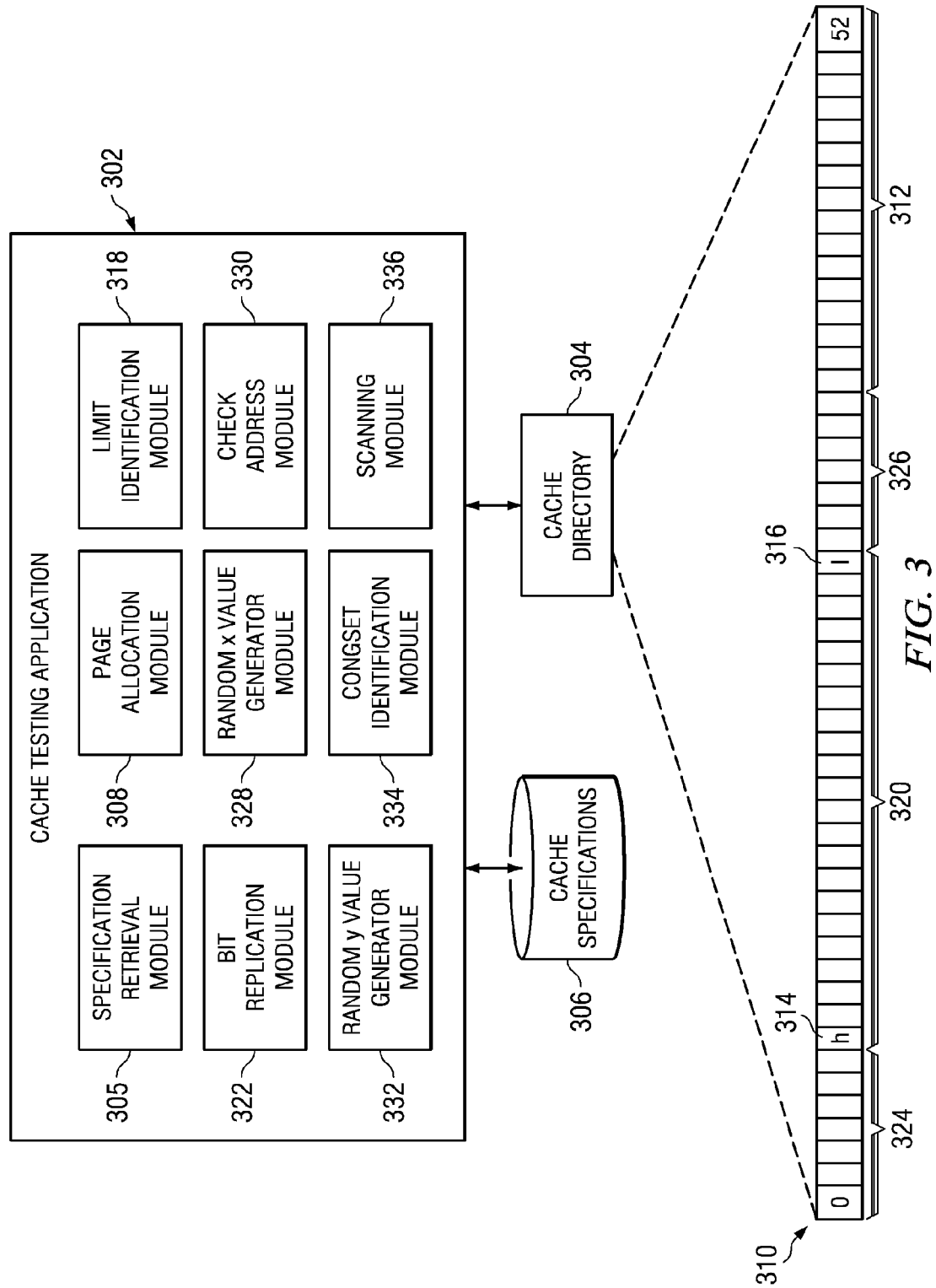
FIG. 3 depicts a functional block diagram of a cache testing application for testing real page number (RPN) address bits in a cache directory in accordance with an illustrative embodiment.

FIG. 3 depicts a functional block diagram of a cache testing application for testing real page number (RPN) address bits in a cache directory in accordance with an illustrative embodiment. Testing of RPN address bits in a cache directory provides more coverage in chip verification, in that, a better identification of any bug(s) in the RPN implementation is provided. Cache testing application 302 employs an optimized algorithm to determine an allocation of memory that will provide an optimal coverage and maximum stress in a minimum time for RPN address bits in cache directory 304 along with existing cache line testing. In order for cache testing application 302 to optimize the RPN address bits in cache directory 304, specification retrieval module 305 retrieves the specifications of a cache from cache specifications data structure 306, which may be a data structure such as main memory 208 of FIG. 2. The cache specifications may include a size of the cache, an associativity of the cache, a size of a page in the cache, a size of a cache line in the cache, or the like. In this illustrative embodiment, the size of the cache may be in bytes and may be represented by $2^p$, the associativity may be represented by $2^k$, the size of a page may be in bytes and may be represented by $2^o$, and the size of a cache line may also be in bytes and may be represented by $2^c$. A cache is comprised of cache lines whose size is architecture dependent. Thus, the total number of cache lines of a cache may be determined by dividing the size of cache by the size of the cache line of the cache, which may be represented by $2^{p-c}$.

Depending upon associativity, a location in main memory may be cached in as many cache lines as are in the cache. If associativity is $2^k$ then each location in main memory may be cached in $2^k$ cache lines. This group of $2^k$ cache lines may be called congruence classes as they are congruent to each other as far as caching a particular memory location is concerned. The total number of congruence classes may be determined by dividing the number of cache lines by the associativity, which may be represented by $2^{p-c-k}$.

In the illustrative embodiments, if page allocation module 308 allocates one page size of memory at a time, then cache testing application 302 may be able to test a number of congruence classes at a time. The number of congruence classes in a page may be computed by dividing size of a page by the size of a cache line, which may be represented by $2^{o-c}$. Thus, the total number of pages required to test each congruence class once, which may be referred to as the CONGSETSIZE, is determined by dividing the total number of congruence classes by the number of congruence classes in a page, which may be represented by $2^{p-c-k-(o-c)}$. In the illustrative embodiments, the total number of pages required to test each congruence class are identified as the rightmost bits in RPN address 310 as represented by γ-RPN 312. The size of RPN address 310 is only exemplary and the illustrative embodiments recognize that RPN address 310 may have other configurations.

The size of the cache where cache testing application 302 operates is not high normally. The illustrative embodiments recognize that there may be an upper bound as well as a lower bound on available memory that is tested. Thus, the illustrative embodiments denote the available memory region where cache testing application 302 may operate by LO and HI for a lower limit and an upper limit, respectively. Corresponding bits in RPN address 310 may be identified which may define the range in which allocations may be performed, which are represented by h bit 314 and l bit 316 respectively. In order for limit identification module 318 to compute h bit 314, limit identification module 318 identifies h bit 314 in RPN address 310 so that $2^h$ kilobytes<HI and $2^{h+1}$ kilobytes>HI. Similarly, in order for limit identification module 318 to identify l bit 316, limit identification module 318 identifies the l bit 316 in RPN address 310 so that $2^l$ kilobytes>LO and $2^{l-1}$ kilobytes<LO.

Some memory in RPN address 310 below l bit 316 and above h bit 314 may not be allocated. In the case of l bit 316, bit replication module 322 may replicate these bits in combination with some bit greater than l bit 316 which is represented by a bits, thus region 320 may also be denoted as α-RPN 320. The bits may be replicated due to limitations in memory. Since the illustrative embodiments may be constrained to select at least 1 bit from the range (α-RPN 320), so a position region 320 above l bit 316 and below h bit 314 may get replicated not by choice but due to constraint. The illustrative embodiments define α-RPN 320 as the bits which need to be set on to ensure that memory is not allocated in a region where the operating system resides or the memory is not allocated in a region which is higher than the memory available. The bits left of h bit 314 in region 324 may not be tested. An address corresponding to any bit in region 324 left of h bit 314 would correspond to an address greater than the HI limit of physical memory.

Thus, the bits in RPN address 310 may be divided into three parts for a simple explanation:

1. The first part is from bit h bit 314 to bit l bit 316 of RPN address 310, which is defined as α-RPN 320.
2. The second part is bits l+1 to 5l-(p-k-o+1), which is defined as β-RPN 326.
3. The third part is bits p-k-o-1 to 5l-o, which is defined as γ-RPN 312.

Once limit identification module 318 has identified h bit 314 and l bit 316 in RPN address 310, random x value generator module 328 generates a random value x between h bit 314 and l bit 316, such that x equals Randrange (l, h). Generating random value x by random x value generator module 328 selects a bit from α-RPN 320. The address given by setting only the $x^{th}$ bit "on" is given by addr=1<<x and check address module 330 performs a check to ensure addr<=HI and addr>=LO. Once the address is confirmed, then random y value generator module 332 randomly generates a value y between 0 to CONGSETSIZE-1, such that y equals Randrange (0,CONGSETSIZE-1). Generating random value y by random y value generator module 332 selects a value from γ-RPN 312. They value may be referred to as the CONGSET number (a particular set of congruence classes within the cache) or index.

In order to determine how many times $y^{th}$ CONGSET has been allocated earlier in a page, CONGSET identification module 334 checks the CONGSET value of y. If y is determined to be $2^k$ or in some cases $2*2^k$, then the $y^{th}$ CONGSET is determined to be saturated. That is, the $y^{th}$ CONGSET has been allocated a maximum predetermined number of times allowed. Thus, a different set of congruence classes different from the current y value which is unsaturated needs to be allocated. If CONGSET identification module 334 identifies that random y value generator module 332 has randomly generated a value y that is determined to be saturated, then CONGSET identification module 334 increments a fail_count by 1.

If CONGSET identification module 334 determines that random y value generator module 332 has randomly generated a value y that is determined to be saturated a predetermined number of times in a row, then random y value generator module 332 randomly generates a value y and scanning module 336 scans RPN address 310 to determine the first index which is not saturated sequentially starting to the right from the random y value. If all the indexes towards the right of the randomly generated y value are saturated, then scanning module 336 starts from index 0 and scans till the randomly generated y value-1 index is reached. Once scanning module 336 identifies an unsaturated y value, then page allocation module 308 allocates a page at the address of the identified y value or 1<<x+y, increments the associated CONGSET value by 1, and sets the fail count equal to 0. This process of page allocation continues until all of the pages required to cover or saturate the entire cache have been allocated.

An example of a cache testing application 302 testing RPN address bits in cache directory 304 is as follows. In order for cache testing application 302 to optimize the RPN address bits in cache directory 304, specification retrieval module 305 retrieves the specifications of the cache from cache specifications data structure 306. In this example, the size of a level two (L2) cache may be 512 KB=$2^9$ KB=$2^{19}$ bytes; therefore, the size of the cache in bytes that may be represented by $2^p$ provides a value for p=19 in this example. Additionally in this example, the associativity of a L2 cache may be 8 way=$2^3$; therefore, the associativity of the cache that may be represented by $2^k$ provides a value for k=3 in this example. Further in this example, the size of a page in an L2 cache may be 4 KB=$2^2$ KB=$2^{12}$ bytes; therefore, the size of a page in bytes that may be represented by $2^o$ provides a value for o=12 in this example. Finally in this example, the size of a cache line in an L2 cache may be 128 bytes=$2^7$ bytes; therefore, the size of the cache line in bytes that may be represented by $2^c$ provides a value for c=7 in this example.

Thus, for this example, the total number of cache lines of the cache may be determined by dividing the size of cache by the size of the cache line of the cache, which may be represented by $2^{p-c}=2^{19-7}=2^{12}$. Depending upon associativity, a location in main memory may be cached in as many cache lines as are in the cache.

In this example, since the associativity is $2^3$ then each location in main memory may be cached in 8 cache lines. In this example, the group of 8 cache lines are the congruence classes and the total number of congruence classes, which is determined by dividing the number of cache lines by the associativity, which may be represented by $2^{p-c-k}=2^{19-7-3}=2^9=512$ congruence classes.

In this example, the number of congruence classes in a page may be computed by dividing size of a page by the size of a cache line, which may be represented by $2^{o-c}=2^{12-7}=2^5=32$ congruence classes in a page. Additionally, the total number of pages required to test each congruence class once (CONGSETSIZE) which is determined by dividing the total number of congruence classes by the number of congruence classes in a page may be represented by $2^{p-c-k-(o-c)}=2^{19-7-3-(12-7)}=2^4=16$ total number of pages required to test each congruence class.

Figure 4:
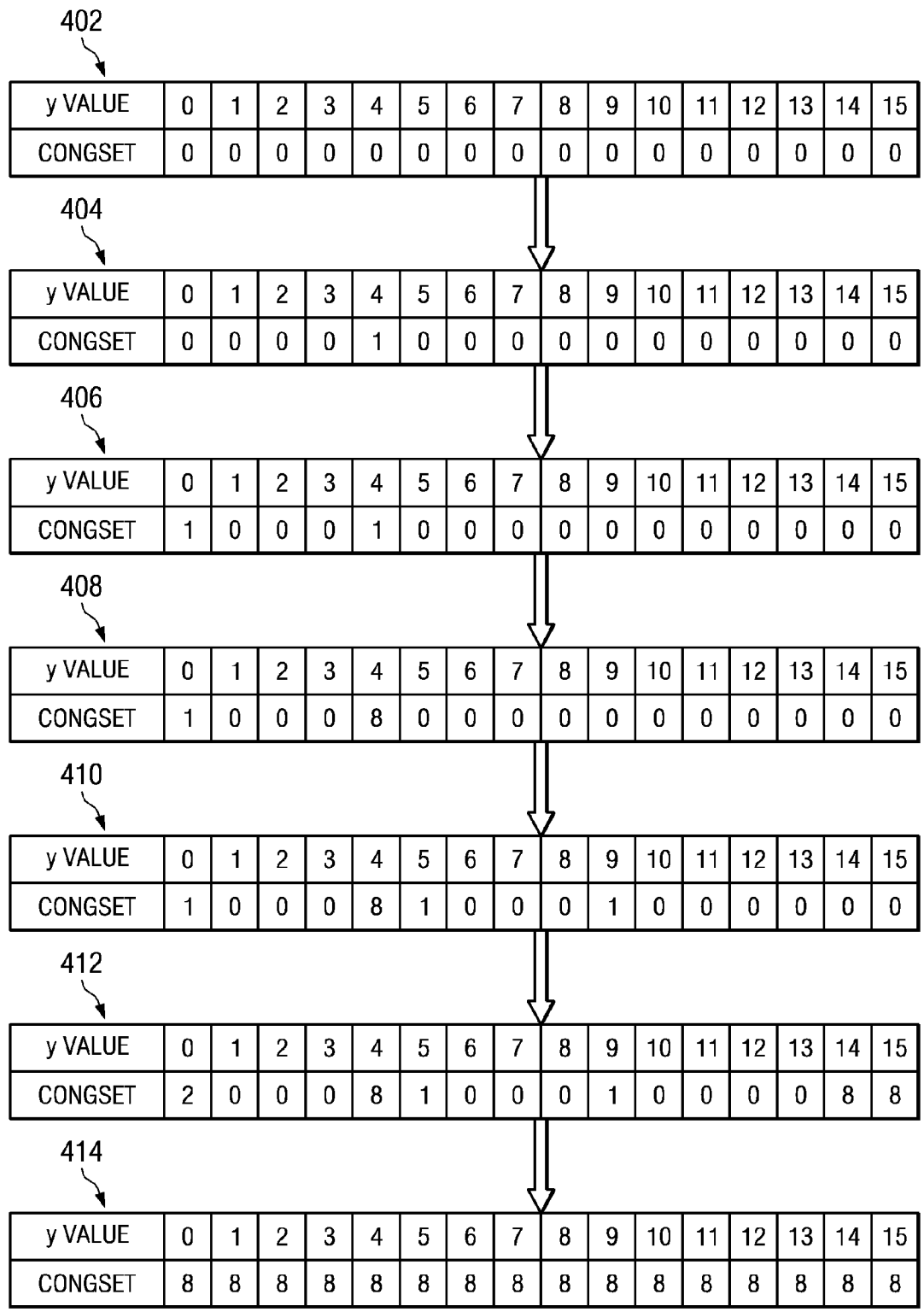
FIG. 4 depicts exemplary arrays that represent the testing of a CONSETSIZE of 16 for the exemplary L2 cache in accordance with an illustrative embodiment.

FIG. 4 depicts exemplary arrays that represent the testing of a CONSETSIZE of 16 for the exemplary L2 cache in accordance with an illustrative embodiment. Initially all the CONGSET values for the CONSETSIZE in array 402 are initialized to 0. After finding out values for HI, LO, h, and l, in the manner described previously, a random value x and a random value y is obtained. Supposing y comes out to be 4, the page allocation module allocates a page at address of the y value or (1<<x)+y to cover all the 32 congclasses (97-128) in CONGSET 4. Array 404 illustrates an update or increment of the CONGSET value associated with they value of 4 to 1 from 0.

Suppose in a next iteration, random value y comes out to be 0, then similarly congclasses (0-32) are allocated once and corresponding CONGSET value 0 is updated or incremented to 1 as is depicted in array 406. Now suppose, in the next 7 iterations the generated value y comes out to be 4 only. The page allocation module allocates a page for each iteration at the same $4^{th}$ CONGSET, congclasses (97-128) and increments the associated CONGSET value by 1. This CONGSET is covered 7 more times this way. The corresponding CONGSET value associated with y value 4 is updated to 8 after these 7 allocations, as is depicted in array 408.

In the next iteration, if the random value y comes out to be 4 again, then the page allocation by the page allocation module should not be done for this address (1<<x+y, remember, random value x between h and l is generated at each iteration) as that would mean allocating congclasses (97-128) 9 times which is not allowed in this example. Thus, the y value 4 is saturated or allocated a maximum predetermined number of times and the array remains in the same state as before. The random y value generator then randomly generates a y value again and if the y value comes out to be a value which is unsaturated then allocation will be done in the same way as described previously. The case when this randomly generated y value again is saturated, the random y value generator then randomly generates a y value one more time. If the y value is unsaturated now, then allocation will be done in the same way as described previously. If after a predetermined number of consecutive attempts, the random y value generator randomly generates a y value that comes out to be saturated, then the scanning module scans RPN address to determine the first y value which is not saturated sequentially starting to the right from the randomly generated y value. In this example, if the first y value which is not saturated sequentially starting to the right from the randomly generated y value of 4 comes out to be 8 then they value would be y value 9. Array 410 illustrates an update of they value 9, to 1 from 0.

When all the y values towards the right of the randomly generated y value are saturated, then the scanning module starts from y value 0 and scans till the randomly generated y value−1 is reached. Array 412 illustrates an event where the randomly generated y value 13, while y value 14 and 15 are saturated. As with this example, the scanning module would go back to scanning from y value 0, and, in this example, y value 0 is found to be unsaturated. Then allocation will be done in the same way as described previously and hence page allocated corresponding to y value 0 is incremented. In this way, at the last iteration when 8*16 allocations are performed, all of the y values in the CONGSET will have CONGSET value of 8, as is depicted in array 414.

Figure 5A:
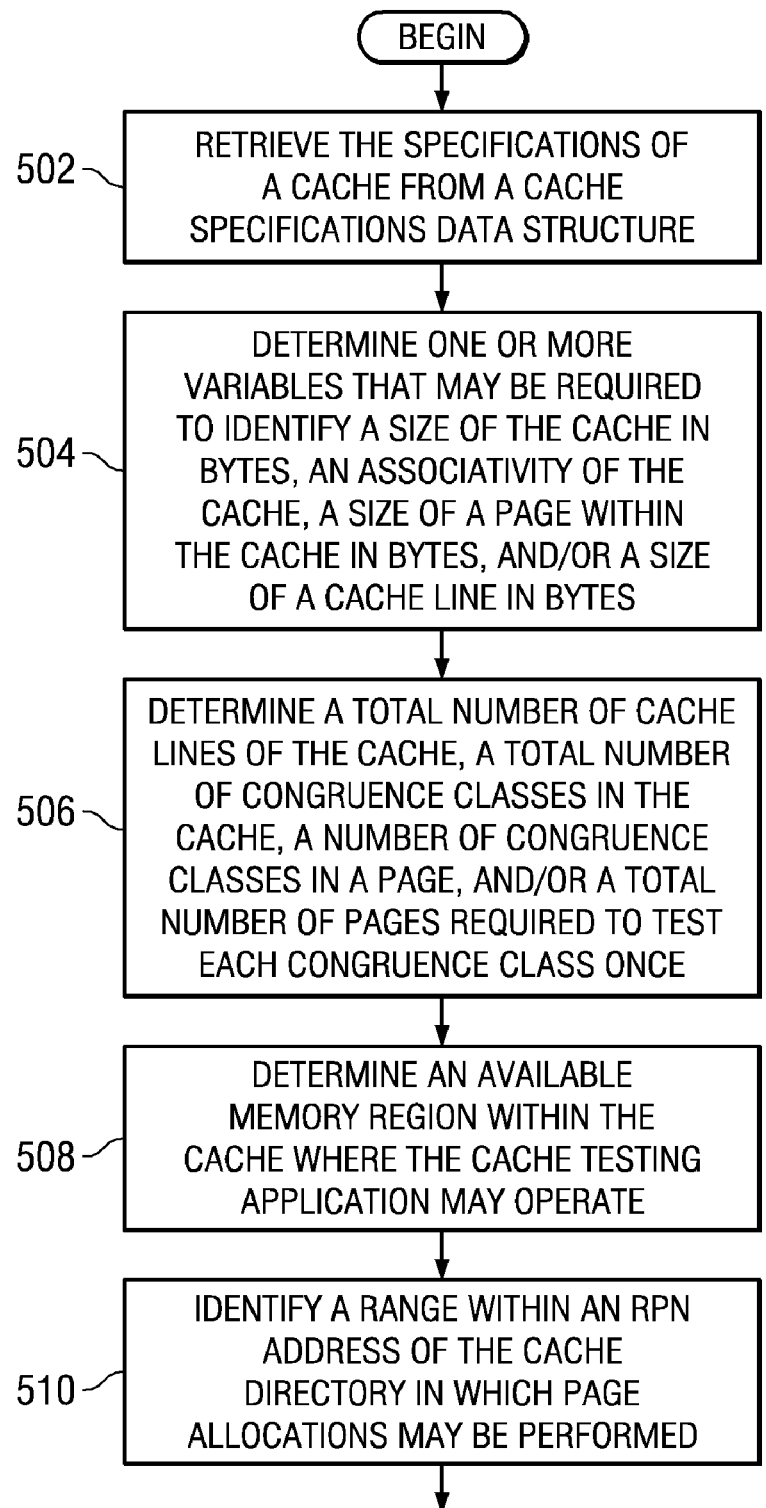
FIGS. 5A and 5B depict an exemplary operation of a cache testing application for testing real page number (RPN) address bits in a cache directory in accordance with an illustrative embodiment.
Figure 5B:
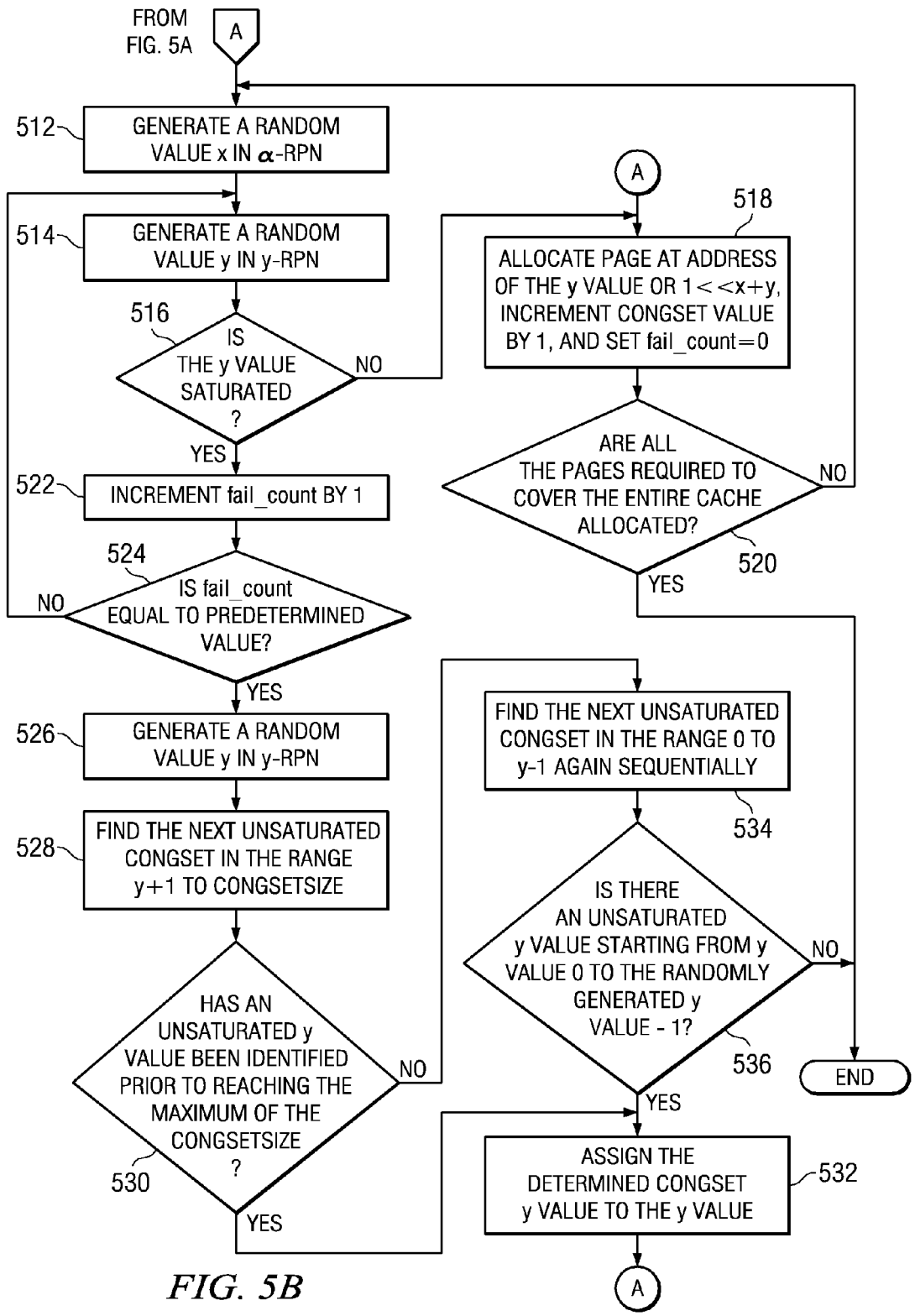

FIGS. 5A and 5B depict an exemplary operation of a cache testing application for testing real page number (RPN) address bits in a cache directory in accordance with an illustrative embodiment. As the operation begins, the cache testing application uses a specification retrieval module to retrieve the specifications of a cache from a cache specifications data structure (step 502). The cache specifications may include a size of the cache, an associativity of the cache, a size of a page, a size of a cache line, or the like. Using the specification of the cache, the cache testing application determines one or more variables that may be required to identify a size of the cache in bytes, an associativity of the cache, a size of a page within the cache in bytes, and/or a size of a cache line in bytes (step 504). Using these variables, the cache testing application determines a total number of cache lines of the cache, a total number of congruence classes in the cache, a number of congruence classes in a page, and/or a total number of pages required to test each congruence class once, which may be referred to as the CONGSETSIZE (step 506).

Using an RPN address, a limit identification module determines an available memory region where the cache testing application may operate, which are identified by a LO and a HI for lower limit and upper limit, respectively (step 508). Then, the limit identification module identifies a range in which page allocations may be performed by a page allocation module, which may be represented by h and l (step 510).

Once limit identification module 318 in FIG. 3 has identified bit h and bit l in the RPN address, a random x value generator module generates a random value x between bit h and bit l, such that x equals Randrange (l, h) (step 512). Generating random value x by the random x value generator module selects a bit from a α-RPN of the RPN address. Then a random y value generator module generates a random value y by selecting a value from γ-RPN of the RPN address (step 514). Generating a random value y by the random y value generator selects a congruence class from the congruence classes associated with the portion of the cache that is to be tested.

In order to determine how many times $y^{th}$ CONGSET has been allocated earlier in a page, a CONGSET identification module checks the CONGSET value associated with the identified y value to determine if the identified y value is saturated or allocated a maximum predetermined number of times (step 516). If at step 516 the CONSET value is not saturated, then the page allocation module allocates a page at the address associated with the y value or 1<<x+y, increments the associated CONGSET value by 1, and sets the fail_count equal to 0 (step 518). Then, the page allocation module determines if all of the pages required to cover the entire cache have been allocated (step 520). If at step 520 all of the pages have been allocated, then the operation terminates. If at step 520 all of the pages have not been allocated, then the operation returns to step 512.

Returning to step 516, if the randomly generated y value is saturated, then the CONGSET identification module increments a fail_count by 1 (step 522) and determines if the fail_count is equal to a predetermined value (step 524). If at step 524 the fail_count is not equal to the predetermined value, then the operation returns to step 514. If at step 524 the fail_count is equal to the predetermined value, then the random y value generator randomly generates a y value (step 526). A scanning module scans the RPN address to identify the first y value which is not saturated sequentially starting to the right from the random y value up to the maximum of the CONGSETSIZE (step 528). The scanning module then determines if an unsaturated y value has been identified prior to reaching the maximum of the CONGSETSIZE (step 530). If at step 530 the scanning module identifies an unsaturated y value prior to reaching the maximum of the CONSETSIZE, then scanning module assigns the determined CONGSET y value to the randomly generated y value (step 532) and the operation proceeds to step 518.

If at step 530 the scanning module reaches the maximum CONSETSIZE and fails to identify an unsaturated y value, then the scanning module starts from y value 0 and scans till the randomly generated y value−1 is reached (step 534). Then the scanning module determines if an unsaturated y value is identifiable starting from y value 0 to the randomly generated y value−1. If at step 536 the scanning module identifies an unsaturated y value in the range from y value 0 and scans to randomly generated y value−1, then scanning module assigns the determines CONGSET y value to the randomly generated y value (step 532) and the operation proceeds to step 518. If at step 536 the scanning module is not able to identify an unsaturated y value starting from y value 0 to the randomly generated y value−1, then cache testing application identifies all of the pages as being allocated and the operation terminates.

Thus, the illustrative embodiments provide mechanisms for testing real page number bits in a cache directory. The illustrative embodiments divide RPN bits into three portions, referred to as α, β, and γ bits. An allocated memory resides in a particular cache lines depending upon γ-RPN bits. α-RPN bits define the boundary of memory addresses which can be allocated depending upon the available memory. In the illustrative embodiments, the idea is to allocate memory considering α-RPN and γ-RPN bits independently to generate an address for allocation. The presented idea is an intelligent selection of α-RPN and γ-RPN bits and a combination of α-RPN and γ-RPN bits to obtain an address for an allocation which would simultaneously test RPN bits as well as different cache lines for each congruence class. Allocation in this way, ensures coverage of the complete cache as well as all possible RPN bits.

As noted above, it should be appreciated that the illustrative embodiments may take the form of an entirely hardware embodiment, an entirely software embodiment or an embodiment containing both hardware and software elements. In one exemplary embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for testing real page number bits in a cache directory, the method comprising:

retrieving a specification of a cache to be tested in order to test the real page number bits of the cache directory associated with the cache;

identifying a range within a real page number address of the cache directory for performing page allocations using the specification of the cache;

generating a random value x that identifies a portion of the real page number bits to be tested;

generating a first random value y that identifies a first congruence class from a set of congruence classes within the portion of the cache to be tested;

determining if the first congruence class associated with the first random value y has been allocated a predetermined number of times; and responsive to the first congruence class associated with the first random value y failing to be allocated the predetermined number of times, allocating one page size of memory for the first congruence class associated with the first random value y; and incrementing a first allocation value associated with the first congruence class by a value of 1.

2. The method of claim 1, further comprising:

responsive to the first congruence class associated with the first random value y being allocated the predetermined number of times, incrementing a failure counter by a value of 1;

determining if the failure counter is equal to a predetermined value;

responsive to the failure counter failing to equal the predetermined value, generating a second random value y that identifies a second congruence class from the set of congruence classes within the portion of the cache to be tested;

determining if the second congruence class associated with the second random value y has been allocated the predetermined number of times; and responsive to the second congruence class associated with the second random value y failing to be allocated the predetermined number of times, allocating one page size of memory for the second congruence class associated with the second random value y; and incrementing a second allocation value associated with the second congruence class by the value of 1.

3. The method of claim 2, further comprising:
responsive to the failure counter equaling the predetermined value, generating a third random value y;
identifying a next congruence class that fails to be allocated the predetermined number of times;
identifying a next value y associated with the next congruence class;
determining if the next congruence class has been allocated the predetermined number of times using the associated next value y; and
responsive to the next congruence class failing to be allocated the predetermined number of times, allocating one page size of memory for the next congruence class associated with the third random value y; and
incrementing a next allocation value associated with the next congruence class by the value of 1.

4. The method of claim 3, wherein identifying the next congruence classes that fails to be allocated the predetermined number of times comprises:
scanning each congruence class in the set of congruence class in order from a third congruence class associated with the third random value y to a maximum congruence set size of the set of congruence classes; and
identifying a congruence class that fails to be allocated the predetermined number of times in order from the third congruence class associated with the third random value y to the maximum congruence set size of the set of congruence classes.

5. The method of claim 4, further comprising:
responsive to a failure to identify the congruence class that fails to be allocated the predetermined number of times in order from the third congruence class associated with the third random value y to the maximum congruence set size of the set of congruence classes, scanning to identify the congruence class that fails to be allocated the predetermined number of times from an initial congruence class in the set of congruence classes up to but not including the third congruence class.

6. The method of claim 1, further comprising:
repeating the generation of a random value of y, the determining, the allocating, and the incrementing steps for all congruence classes in the set of congruence classes until all of the congruence classes have been allocated the predetermined number of times.

7. The method of claim 1, wherein identifying the range within the real page number address of the cache directory for performing page allocations comprises:
determining an available memory region within the cache where testing of the memory region along with real page number bits in the cache directory is to be performed.

8. The method of claim 7, wherein determining the available memory region within the cache where testing of memory region along with testing of real page number bits in cache directory is to be performed comprises:
determining one or more variables required to identify a size of the cache in bytes, an associativity of the cache, a size of a page within the cache in bytes, and a size of a cache line in bytes; and
determining a total number of cache lines of the cache associated with the cache directory, a total number of congruence classes in the cache, a number of congruence classes in a page of the cache, and a total number of pages required to test each congruence class once.

9. A computer program product comprising a computer-readable storage medium having a computer readable program stored thereon, wherein the computer readable program, when executed on a computing device, causes the computing device to:
retrieve a specification of a cache to be tested in order to test the real page number bits of the cache directory associated with the cache;
identify a range within a real page number address of the cache directory for performing page allocations using the specification of the cache;
generate a random value x that identifies a portion of the real page number bits to be tested;
generate a first random value y that identifies a first congruence class from a set of congruence classes within the portion of the cache to be tested;
determine if the first congruence class associated with the first random value y has been allocated a predetermined number of times; and
responsive to the first congruence class associated with the first random value y failing to be allocated the predetermined number of times, allocate one page size of memory for the first congruence class associated with the first random value y; and
increment a first allocation value associated with the first congruence class by a value of 1.

10. The computer program product of claim 9, wherein the computer readable program further causes the computing device to:
responsive to the first congruence class associated with the first random value y being allocated the predetermined number of times, increment a failure counter by a value of 1;
determine if the failure counter is equal to a predetermined value;
responsive to the failure counter failing to equal the predetermined value, generate a second random value y that identifies a second congruence class from the set of congruence classes within the portion of the cache to be tested;
determine if the second congruence class associated with the second random value y has been allocated the predetermined number of times; and
responsive to the second congruence class associated with the second random value y failing to be allocated the predetermined number of times, allocate one page size of memory for the second congruence class associated with the second random value y; and
increment a second allocation value associated with the second congruence class by the value of 1.

11. The computer program product of claim 10, wherein the computer readable program further causes the computing device to:
responsive to the failure counter equaling the predetermined value, generate a third random value y;
identify a next congruence class that fails to be allocated the predetermined number of times;
identify a next value y associated with the next congruence class;
determine if the next congruence class has been allocated the predetermined number of times using the associated next value y; and
responsive to the next congruence class failing to be allocated the predetermined number of times, allocate one page size of memory for the next congruence class associated with the third random value y; and increment a next allocation value associated with the next congruence class by the value of 1.

12. The computer program product of claim 11, wherein the computer readable program to identify the next congruence class that fails to be allocated the predetermined number of times further causes the computing device to:

scan each congruence class in the set of congruence classes in order from a third congruence class associated with the third random value y to a maximum congruence set size of the set of congruence classes; and identify a congruence class that fails to be allocated the predetermined number of times in order from the third congruence class associated with the third random value y to the maximum congruence set size of the set of congruence classes.

13. The computer program product of claim 12, wherein the computer readable program further causes the computing device to:

responsive to a failure to identify the congruence class that fails to be allocated the predetermined number of times in order from the third congruence class associated with the third random value y to the maximum congruence set size of the set of congruence classes, scan to identify the congruence class that fails to be allocated the predetermined number of times from an initial congruence class in the set of congruence classes up to but not including the third congruence class.

14. The computer program product of claim 9, wherein the computer readable program further causes the computing device to:

repeat the computer readable program to generate a random value of y, determine, allocate, and increment for all congruence classes in the set of congruence classes until all of the congruence classes have been allocated the predetermined number of times.

15. An apparatus, comprising:

a processor; and a memory coupled to the processor, wherein the memory comprises instructions which, when executed by the processor, cause the processor to:

retrieve a specification of a cache to be tested in order to test the real page number bits of the cache directory associated with the cache;

identify a range within a real page number address of the cache directory for performing page allocations using the specification of the cache;

generate a random value x that identifies a portion of the real page number bits to be tested;

generate a first random value y that identifies a first congruence class from a set of congruence classes within the portion of the cache to be tested;

determine if the first congruence class associated with the first random value y has been allocated a predetermined number of times; and responsive to the first congruence class associated with the first random value y failing to be allocated the predetermined number of times, allocate one page size of memory for the first congruence class associated with the first random value y; and increment a first allocation value associated with the first congruence class by a value of 1.

16. The apparatus of claim 15, wherein the instructions further cause the processor to:

responsive to the first congruence class associated with the first random value y being allocated the predetermined number of times, increment a failure counter by a value of 1;

determine if the failure counter is equal to a predetermined value;

responsive to the failure counter failing to equal the predetermined value, generate a second random value y that identifies a second congruence class from the set of congruence classes within the portion of the cache to be tested;

determine if the second congruence class associated with the second random value y has been allocated the predetermined number of times; and responsive to the second congruence class associated with the second random value y failing to be allocated the predetermined number of times, allocate one page size of memory for the second congruence class associated with the second random value y; and increment a second allocation value associated with the second congruence class by the value of 1.

17. The apparatus of claim 16, wherein the instructions further cause the processor to:

responsive to the failure counter equaling the predetermined value, generate a third random value y;

identify a next congruence class that fails to be allocated the predetermined number of times;

identify a next value y associated with the next congruence class;

determine if the next congruence class has been allocated the predetermined number of times using the associated next value y; and responsive to the next congruence class failing to be allocated the predetermined number of times, allocate one page size of memory for the next congruence class associated with the third random value y; and increment a next allocation value associated with the next congruence class by the value of 1.

18. The apparatus of claim 17, wherein the instructions to identify the next congruence class that fails to be allocated the predetermined number of times further cause the processor to:

scan each congruence class in the set of congruence classes in order from a third congruence class associated with the third random value y to a maximum congruence set size of the set of congruence classes; and identify a congruence class that fails to be allocated the predetermined number of times in order from the third congruence class associated with the third random value y to the maximum congruence set size of the set of congruence classes.

19. The apparatus of claim 18, wherein the instructions further cause the processor to:

responsive to a failure to identify the congruence class that fails to be allocated the predetermined number of times in order from the, third congruence class associated with the third random value y to the maximum congruence set size of the set of congruence classes, scan to identify the congruence class that fails to be allocated the predetermined number of times from an initial congruence class in the set of congruence classes up to but not including the third congruence class.

20. The apparatus of claim 15, wherein the instructions further cause the processor to:

repeat the instructions to generate a random value of y, determine, allocate, and increment for all congruence classes in the set of congruence classes until all of the congruence classes have been allocated the predetermined number of times.

* * * * *